(12) United States Patent
Nieminen et al.

(10) Patent No.: US 6,437,711 B1
(45) Date of Patent: Aug. 20, 2002

(54) SEGMENTATION MECHANISM FOR A BLOCK ENCODER AND METHOD FOR ENCODING WITH A BLOCK ENCODER

(75) Inventors: Esko Nieminen; Lauri Pirttiaho, both of Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/719,585

(22) PCT Filed: Apr. 14, 2000

(86) PCT No.: PCT/FI00/00322
§ 371 (c)(1),
(2), (4) Date: Dec. 14, 2000

(87) PCT Pub. No.: WO00/64057
PCT Pub. Date: Oct. 26, 2000

(30) Foreign Application Priority Data

Apr. 16, 1999 (FI) .................................................. 990863

(51) Int. Cl.⁷ .............................................. H03M 7/40
(52) U.S. Cl. ............................. 341/67; 341/69; 341/50; 341/59; 341/58; 341/65; 375/265; 375/259; 714/701; 714/702; 714/751; 714/755; 714/746; 714/786; 370/538; 370/474; 370/535
(58) Field of Search .............................. 341/67, 50, 65, 341/59, 58, 69

(56) References Cited

U.S. PATENT DOCUMENTS

| | | | |
|---|---|---|---|
| 4,929,946 A | | 5/1990 | O'Brien et al. |
| 5,177,482 A | * | 1/1993 | Cideciyan et al. ............. 341/59 |
| 5,220,327 A | * | 6/1993 | Abbiate et al. ............. 341/143 |
| 5,386,212 A | * | 1/1995 | Shen et al. ..................... 341/67 |
| 5,734,430 A | * | 3/1998 | Mishima et al. ............... 341/65 |
| 5,781,133 A | * | 7/1998 | Tsang ........................... 341/59 |
| 5,790,569 A | | 8/1998 | Kojima et al. |
| 5,889,791 A | | 3/1999 | Yang |
| 6,271,782 B1 | * | 8/2001 | Steensgaard-Madsen .... 341/143 |
| 6,334,197 B1 | * | 12/2001 | Eroz et al. ................... 714/701 |
| 6,339,834 B1 | * | 1/2002 | Crozier et al. ............... 714/701 |
| 6,347,385 B1 | * | 2/2002 | Cui et al. .................... 714/701 |

FOREIGN PATENT DOCUMENTS

| | | |
|---|---|---|
| DE | 197 32 626 | 6/1998 |
| EP | 0 840 531 | 5/1998 |
| WO | WO 99/09724 | 2/1999 |
| WO | WO 99/18673 | 4/1999 |

OTHER PUBLICATIONS

Patent Abstract of Japan, No. 4245881 "Segment Method for Encoding Data" Nakaya Hideo, First Page.

* cited by examiner

Primary Examiner—Patrick Wamsley
Assistant Examiner—Lam T. Mai
(74) Attorney, Agent, or Firm—Pillsbury Winthrop LLP

(57) ABSTRACT

A method encodes an input data block with a block encoder. The block encoder is capable of processing consecutive coding blocks whose size has an upper limit which is smaller than the size of the input data block. The method comprises: determining the length of the input data block before encoding any of its data with the block encoder; dividing the input data block to a plurality of segments wherein all segments are of substantially equal size and no segment is larger than the upper limit; and processing each segment with the block encoder. If the last segment is shorter than the remaining segments, fill bits can be added to the last segment such that its length equals that of the remaining segments.

10 Claims, 1 Drawing Sheet

SEGMENTATION MECHANISM FOR A BLOCK ENCODER AND METHOD FOR ENCODING WITH A BLOCK ENCODER

BACKGROUND OF THE INVENTION

The invention relates to methods and equipment for block encoders. As is well known, block encoders are frequently used for error correction. An example of a block encoder is a so-called turbo (en)coder, as disclosed in reference 1.

FIG. 1 is a block chart of a turbo encoder TE which is connected to a corresponding turbo decoder TD via a (transmission) channel. A typical turbo encoder conveys the original information directly to the channel. These bits are called systematic bits. Additionally, the turbo encoder adds redun-dancy (parity) with simple encoders 1 and 2, the latter of which is preceded by an interleaver P, which permutes the bits of the original information. However, details of the block encoder are not relevant for understanding the invention, and reference is made to relevant literature.

Unlike streaming encoders, block encoders process. one or more data blocks at a time. An input data block whose size exceeds the block size of the block encoder must be divided into smaller segments such that no segment is larger than the block size of the block encoder. This is why block encoders are particularly suitable for applications with a fixed input block size. A problem with block encoders is that they do not easily lend themselves to applications having a variable (dynamic) input block size. In other words, what to do with the last few segments of the input data block, remains an open question.

DISCLOSURE OF THE INVENTION

An object of the invention is to provide a mechanism for using block encoders with applications having a variable (dynamic) input block size. The mechanism should be generic in order to be applicable to a wide variety of block encoders.

This object is achieved with a method and equipment which are characterized by what is disclosed in the attached independent claims. Preferred embodiments of the invention are disclosed in the attached dependent claims.

A straightforward solution would be to fill the segment of the input data block to the block size of the block encoder. Assuming a block size of 8 kilobits (kb), a 14-kb input data block would be divided into a first segment of 8 kb and second (last) segment with a net size of 6 kb and 2 kb of fill (padding) bits. A benefit of this straightforward solution is that the block encoder does not have to adapt to varying input block sizes.

The invention is based on the idea that for an input data block whose size exceeds the block size of the block encoder:

1) before coding is started, the size of the input data block is determined; and
2) the input data block is divided into segments of approximately equal size such that no segment is larger than the block size of the block encoder.

An aspect of the invention is a segmentation device for segmenting an input data block for processing with a block encoder, wherein the block encoder is capable of processing consecutive coding blocks whose size has an upper limit which is smaller than the size of the input data block. The segmentation device is arranged to: determine the length of the input data block before applying any of its data to the block encoder; divide the input data block to a plurality of segments wherein all segments are of substantially equal size and no segment is larger than the upper limit; and to apply each segment to the block encoder.

According to a preferred embodiment of the invention, the input data block is divided into the least possible number of segments. In other words, the segments are as large as possible.

According to an alternative embodiment, the input data block is divided into $2^n$ segments where n is a positive integer.

According to yet another preferred embodiment of the invention, if dividing the input data block produces a last segment which is shorter than the remaining segments, the input data block or the last segment is padded with a few fill bits until the length of the last segment equals that of the remaining segments. However, in contrast to the straight-forward solution, the last segment is not padded to the full block size of the block encoder (unless the remaining segments happen to be of that size too).

BRIEF DESCRIPTION OF THE DRAWINGS

The invention will be described in more detail by means of preferred embodiments with reference to the appended drawing wherein.

DETAILED DESCRIPTION OF THE INVENTION

Figure 1:
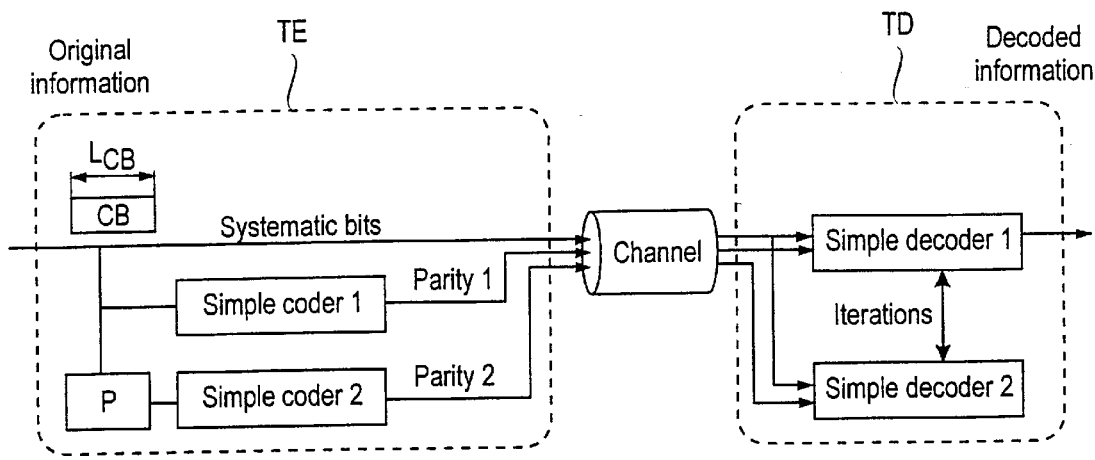
FIG. 1 is a block chart of a turbo encoder.

Various embodiments of the invention will be described in connection with a turbo encoder, an example of which is disclosed in reference 1. However, details of the turbo encoder, or any other encoder, are not relevant for understanding the invention.

Implementing a turbo encoder (and the corresponding decoder) can be facilitated by limiting the length of the coding block. A reasonable value for the length of the coding block is 8192 bits including the user data, a possible error detection field (CRC) and the termination. The following naming conventions will be used:

$N_{TAIL}$ = the number of termination bits $T_{DELAY}$ (seconds) = the length of the user data block $R_{DATA}$ (bits per second) = the user data rate of the service $N_{EXTRA}$ = the number of other bits added to the original user data (CRC etc.)

$L_{CB}$ = max length of the coding block.

The following condition has to be satisfied:

$$R_{DATA}*T_{DELAY}+N_{EXTRA}+N_{TAIL} \leq L_{CB} \quad [1]$$

If this condition is not satisfied the data to be encoded must be segmented so that each separate segment satisfies the condition. The number of segments $N_S$ has to satisfy the condition:

$$\text{round\_up}((R_{DATA}*T_{DELAY}+N_{EXTRA})/N_S)+N_{TAIL} \leq L_{CB} \quad [2]$$

It is preferable to choose the smallest $N_S$ satisfying the inequality [2]. $N_S$ can be calculated from:

$$N_S = \text{round\_up}((R_{DATA}*T_{DELAY}+T_{EXTRA})/(L_{CB}-N_{TAIL})) \quad [3]$$

It may happen that all the encoding blocks do not end up being of the same length, i.e. that $(R_{DATA}*T_{DELAY}+N_{EXTRA})/N_S$ is not an integer. In such a case, there are at least two possible solutions, which will be called algorithms A and B. In algorithm A, the last segment is allowed to have a different length than the other segments. In algorithm B, a number $N_{FILL}$ of fill bits (e.g. zeroes) are added to the input data so that $(R_{DATA}*T_{DELAY}+N_{EXTRA}+N_{FILL})/N_S$ is the smallest possible integer. (Alternatively, the fill bits can be appended to the last segment after segmentation.)

Algorithm A

Algorithm A allows the last segment to be shorter than the other segments. Algorithm A uses the following Inputs:

$R_{DATA}$=the user data rate (bits per second)

$T_{DELAY}$=encoding user data block length (seconds)

$N_{EXTRA}$=extra data to be appended to the user data before encoding (bits)

$N_{TAIL}$=number of tail bits to be appended to the encoding blocks

Algorithm A produces the following outputs:

$N_S$=number of segments $N_{TB}$=number of bits in the turbo encoder input blocks except the last one $N_{LAST\_TB}$=number of bits in the last turbo encoder input block In algorithm A the following computations will be performed:

Let $N_S=\text{round}_{13}\text{\_up}((R_{DATA}*T_{DELAY}+N_{EXTRA})/(L_{CB}-N_{TAIL}))$ Let $N_{TB}=\text{round\_up}((R_{DATA}*T_{DELAY}+N_{EXTRA})/N_S)+N_{TAIL}$;

Let $N_{REM}$=remainder of $(R_{DATA}*T_{DELAY}+N_{EXTRA})/N_S$;

If $N_{REM}$ is not equal to zero then $N_{LAST\_TB}=N_{TB}-N_S+N_{REM}$ else $N_{LAST\_TB}=N_{TB}$. End.

If algorithm A is used, an adaptive turbo interleaver is needed since the last input segment to the turbo encoder may be shorter than the others. The number of systematic bits in the output of the encoder is $$R_{DATA}*T_{DELAY}+N_{EXTRA}+N_S*N_{TAIL} \quad [4]$$

Thus there are no additional bits other than the ones due to the termination of each segment.

Algorithm B

Figure 2:
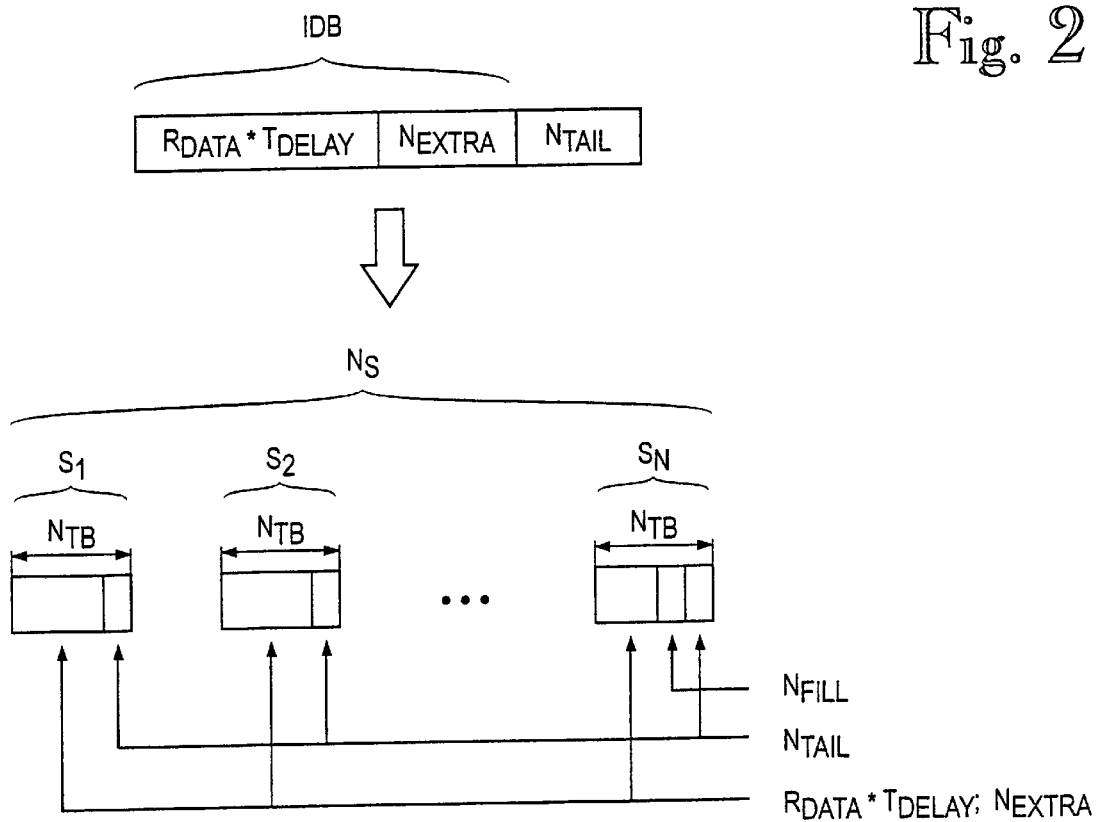
FIG. 2 illustrates dividing an input data block to a number of segments for the turbo encoder.

As shown in FIG. 2, in algorithm B all input segments to the turbo encoder will be of equal size. The inputs to algorithm B are:

$R_{DATA}$=the user data rate (bits per second)

$T_{DELAY}$=encoding user data block length (seconds)

$N_{EXTRA}$=extra data to be appended to the user data before encoding (bits)

$N_{TAIL}$=number of tail bits to be appended to the encoding blocks

The outputs from algorithm B are:

$N_S$=number of segments $N_{TB}$=number of bits in the turbo encoder input blocks $N_{FILL}$=number of fill bits (e.g. zero) in the last turbo encoder input block In algorithm B, the following computations will be performed:

Let $N_S=\text{round}_{13}\text{\_up}((R_{DATA}*T_{DELAY}+N_{EXTRA})/(L_{CB}-N_{TAIL}))$ Let $N_{TB}=\text{round\_up}((R_{DATA}*T_{DELAY}+N_{EXTRA})/N_S)+N_{TAIL}$ Let $N_{REM}$=remainder of $(R_{DATA}*T_{DELAY}+N_{EXTRA})/N_S$ if $N_{REM}\neq 0$ then insert $N_{FILL}=(N_S-N_{REM})$ zero bits to the end of the input data else $N_{FILL}=0$.

All input segments to the turbo encoder are of equal size and therefore the same turbo interleaver can be used for all segments. In this case the number of systematic bits over an entire channel interleaving block at the output of the turbo encoder is:

$$N_S*(\text{round\_up}((R_{DATA}*T_{DELAY}+N_{EXTRA})/N_S)+N_{TAIL}) \quad [5]$$

Thus there may be some additional bits other than the termination bits.

Modification to algorithms A and B

In the above algorithms A and B, the length of input segment to the turbo encoder is maximised by choosing the smallest possible number of segments $N_S$. In some cases it may be preferable to use a number of segments $N_S$. which is a power of 2, but this will shorten the input segments to the turbo encoder. In this case, the first step of the above algorithms A and B would be replaced by the following three steps:

Let $n_S=\text{round\_up}((R_{DATA}*T_{DELAY}+N_{EXTRA})/(L_{CB}-N_{TAIL}))$;

Let $m=\text{round\_up}(\log_2 n_S)$;

Let $N_S=2^m$.

References

1. C. Berrou, A. Glavieux, P. Thitimajshima: *Near Shannon limit error-correcting coding and decoding: Turbo-codes*, IEEE International Conference on Communications, ICC 1993, Geneva, Switzerland 23–26 May, 1993, Vol. 2, pp. 1064–1070.

All references are incorporated herein by reference.

What is claimed is:

1. A method for encoding an input data block with a block encoder, the block encoder being capable of processing consecutive coding blocks whose size has an upper limit which is smaller than the size of the input data block, the method comprising:

determining the length of the input data block before encoding any of its data with the block encoder;

dividing the input data block into a plurality of segments wherein all segments are of substantially equal size and no segment is larger than the upper limit; and processing each segment with the block encoder.

2. The method according to claim 1, further comprising adding fill bits to the last segment such that its length equals that of the remaining segments if the last segment is shorter than the remaining segments.

3. The method according to claim 1, further comprising adding fill bits to the input data block such that its length is an exact multiple of the upper limit if the length of the input data block is not an exact multiple of the upper limit.

4. The method according to claim 1, wherein the number of segments is $2^n$ where n is a positive integer.

5. The method according to claim 1, further comprising adding one or more fill bits to one or more segments such that all segments are of equal size.

6. A segmentation device for segmenting an input data block for processing with a block encoder, the block encoder being capable of processing consecutive coding blocks whose size has an upper limit which is smaller than the size of the input data block, wherein the segmentation device is arranged to:

determine the length of the input data block before applying any of its data to the block encoder;

divide the input data block to a plurality of segments wherein all segments are of substantially equal size and no segment is larger than the upper limit; and apply each segment to the block encoder.

7. A method for segmenting an input data block for encoding with a block encoder, the block encoder being capable of processing consecutive coding blocks whose size has an upper limit which is smaller than the size of the input data block, the method comprising:

determining the size of the input data block before encoding any of its data with the block encoder;

segmenting the input data block into a plurality of segments, wherein the segmenting step includes:
   (a) determining a segment size that is not larger than said upper limit;
   (b) making all segments substantially equal in size to said segment size; and
   (c) adding one or more fill bits to each segment that is shorter than the segment size if the size of said input data block is not an exact multiple of the segment size; and applying each segment to said block encoder for processing.

8. A segmentation device for segmenting an input data block for processing with a block encoder, the block encoder being capable of processing consecutive coding blocks whose size has an upper limit which is smaller than the size of the input data block, the segmentation device comprising:

means for determining the length of the input data block before applying any of its data to the block encoder;

segmenting means for segmenting the input data block into a plurality of segments, wherein the segmenting means includes:
   (a) means for determining a segment size that is not larger than said upper limit;
   (b) means for making all segments substantially equal in size to said segment size; and
   (c) means for adding one or more fill bits to each segment that is shorter than the segment size if the size of said input data block is not an exact multiple of the segment size.

9. A method for segmenting an input data block for encoding with a block encoder, the block encoder being capable of processing consecutive coding blocks whose size has an upper limit which is smaller than the size of the input data block, the method comprising:

determining the size of the input data block before encoding any of its data with the block encoder;

segmenting the input data block into a plurality of segments, wherein the segmenting step includes:
   (a) determining a segment size that is not larger than said upper limit;
   (b) making all segments substantially equal in size to said segment size; and
   (c) adding one or more fill bits to at least one segment that is shorter than the segment size if the size of said input data block is not an exact multiple of the segment size; and applying each segment to said block encoder for processing.

10. A segmentation device for segmenting an input data block for processing with a block encoder, the block encoder being capable of processing consecutive coding blocks whose size has an upper limit which is smaller than the size of the input data block, the segmentation device comprising:

means for determining the length of the input data block before applying any of its data to the block encoder;

segmenting means for segmenting the input data block into a plurality of segments, wherein the segmenting means includes:
   (a) means for determining a segment size that is not larger than said upper limit;
   (b) means for making all segments substantially equal in size to said segment size; and
   (c) means for adding one or more fill bits to at least one segment that is shorter than the segment size if the size of said input data block is not an exact multiple of the segment size.

* * * * *